(12) United States Patent
Muto

(10) Patent No.: US 6,656,795 B1
(45) Date of Patent: Dec. 2, 2003

(54) METHOD OF MANUFACTURING SEMICONDUCTOR MEMORY ELEMENT

(75) Inventor: Koki Muto, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 10/325,836

(22) Filed: Dec. 23, 2002

(30) Foreign Application Priority Data

Jun. 28, 2002 (JP) ........................................ 2002-190969

(51) Int. Cl.[7] ........................................ H01L 21/8247
(52) U.S. Cl. ........................ 438/262; 438/297; 438/401
(58) Field of Search ............................... 438/201, 211, 438/258, 262, 263, 297, 401

(56) References Cited

U.S. PATENT DOCUMENTS

| | | | |
|---|---|---|---|
| 6,221,777 B1 * | 4/2001 | Singh et al. | 438/633 |
| 6,288,423 B1 * | 9/2001 | Sugaya | 257/315 |
| 6,518,110 B2 * | 2/2003 | Wen | 438/201 |
| 6,528,841 B2 * | 3/2003 | Choi et al. | 257/315 |

FOREIGN PATENT DOCUMENTS

JP          5072713          3/1993

* cited by examiner

Primary Examiner—Chandra Chaudhari
(74) Attorney, Agent, or Firm—Volentine Francos, PLLC

(57) ABSTRACT

A method of manufacturing a semiconductor memory element is disclosed. The method includes arranging a mask on the upper surface of a semiconductor substrate, using the mask to conduct exposure, forming first, second, and third element-isolation regions on the semiconductor substrate surface, and forming a gate electrode. A resist film is formed on the substrate. On the mask, auxiliary patterns are made at the each central portion of first, second, and third patterns. In the exposure with the mask, first, second, and third resist patterns is formed on the resist film. The resist patterns respectively correspond to the patterns on the mask. The gate electrode extending in the second direction is formed from the upper surface of the second element-isolation region to the upper surface of the third electrode element-isolation region through an area between the second and third element-isolation regions.

19 Claims, 18 Drawing Sheets

METHOD OF MANUFACTURING SEMICONDUCTOR MEMORY ELEMENT

BACKGROUND OF THE INVENTION

1. Field of the Invention

The present invention relates to a method of manufacturing a semiconductor memory element such as an EPROM, EEPROM, and or the like.

2. Description of the Related Art

In manufacture of a semiconductor, especially, as a memory (memory element), memory cells are fabricated by repeating lattice patterns to obtain a high-density memory.

For example, an EPROM (Electrically Programmable Read-Only Memory) is manufactured as shown in FIGS. 1 to 5.

As shown in FIG. 1, a predetermined pattern is transferred by photolithography. In FIG. 1, reference numeral 1 indicates a blank pattern, and reference numeral 2 indicates a remaining pattern. In this case, as a resist, a positive-type resist is used. Each of the patterns 1 is transferred by photolithography and formed to have substantially a single size to obtain a high-density memory cell.

Etching, ion implantation, and oxidization are performed. Element-isolation shown in FIG. 2 is further performed. FIG. 2 is a sectional view along an A–B section in FIG. 1 after the element-isolation is performed.

A gate oxide film, a polysilicon serving as a floating gate, an insulating film, and an electrode serving as a control gate are formed. Thereafter, as shown in FIG. 3, a desired pattern is transferred by photolithography through a mask 31 for forming a gate electrode.

When processes such as etching and ion plantation are performed, a semiconductor memory on which a control gate, a floating gate, a source, and a drain are formed as shown in FIG. 4 is fabricated.

FIG. 4 is a sectional view along a C–D section in FIG. 3. Reference numeral 41 denotes a control gate, reference numeral 42 denotes a floating gate, reference numeral 43 denotes a source, and reference numeral 44 denotes a drain.

Thereafter, processes including film application and photolithography are performed. As shown in FIG. 5, a contact 51 and a metal wiring layer 52 serving as word lines are formed to make it possible to select a cell.

In order to appropriately perform element-isolation, in patterning by photolithography, as shown in FIG. 6, a dimension indicated by reference numeral 63 is a dimension of a control gate. The shapes of the patterns 1 must be controlled such that the dimension of the lower parts of the control gates are equal to each other.

In a conventional art, these control operations are performed by devising a mask used when a predetermined pattern is transferred.

As shown in FIG. 6, a dimension indicated by reference numeral 61 influences a source line resistance, and a dimension indicated by reference numeral 62 is used for a control gate 65. In this case, when the width indicated by reference numeral 61 decreases, the source line resistance increases. When the width indicated by reference numeral 62 decreases, the control gate comes out of the element-isolation pattern to form a short circuit.

Specific examples of variations in dimension with respect to a focus at dimensions indicated by reference numerals 64 and 61 are shown in FIGS. 7 and 8.

In FIG. 7 showing a variation in dimension with respect to a focus at the dimension indicated by reference numeral 64, for example, it is understood that 0.60 μm or more can be secured as a depth of focus when the dimension is set to be 0.30 ±0.02 μm.

As in FIG. 8 showing a variation in dimension for focusing at the dimension indicated by reference numeral 61, when a dimensional gauge of ±0.02 μm as in FIG. 7 and a central dimension of 0.31 μm are set, a depth of focus is 0.30 μm. It is understood that the depth of focus at the dimension indicated by reference numeral 61 is half or less of the depth of focus at the dimension indicated by reference numeral 64.

In particular, in FIG. 8, a variable in dimension indicated by reference numeral 61 is large. It is difficult to secure margins to the above-mentioned source line resistance and the control gate and to reduce the dimension.

In an experiment by the present inventor, when simulation which formed a resist pattern by using a conventional mask shown in FIG. 9 was performed, a focus exposure distribution as shown in FIG. 10 was obtained.

In the focus execution distribution, it is understood that as curves in the graph become flat near the center, and as intervals between the curves become small, the mask can cope with a variation in exposure energy and a variation in focus.

As is apparent from the focus exposure distribution in FIG. 10, a depth of focus at a dimension of 0.18±0.04 μm is about 0.40 μm. In general, a depth of focus of 0.1 μm or more is required. It is understood that the dimension easily varies by the variation in process.

When an illuminance distribution from which a finish image of a resist pattern can be supposed was observed, it was understood that the illuminance distribution is high near the central portion and low at upper and lower portions in the longitudinal direction.

The illuminance distribution and the focus exposure distribution can be measured by a simulation device such as PROLITH such that N.A.=0.60 and σ=0.75, and the thickness of a KrF resist is 4200 Å.

As is apparent from the above result, in order to form a resist pattern by using a conventional mask, it is difficult to decrease a variation in dimension with respect to a variation in focus. In addition, the conventional mask has the following problems. That is, desired characteristics cannot be obtained, and the control gate comes out of the element-isolation pattern to make a short circuit.

SUMMARY OF THE INVENTION

As described above, it is an object of the present invention to provide a method of manufacturing a semiconductor memory element which can decrease a variation in dimension with respect to a variation in focus.

The object is achieved by the invention described below. More specifically, a first aspect of the invention provides a method of manufacturing a semiconductor memory element including (1) arranging a mask on the upper surface of a semiconductor substrate on which a resist film is formed, (2) using the mask to conduct exposure, (3) using the first, second and third resist patterns to form first, second, and third element-isolation regions, and (4) forming a gate electrode. With respect to arranging a mask, the mask has first, second and third rectangular patterns. The first rectangular pattern has a first direction as a longitudinal direction thereof. The second rectangular pattern is arranged apart from the first pattern in the first direction and has the first direction as a longitudinal direction thereof. The third rectangular pattern is arranged apart from the first and second patterns in a second direction intersecting the first direction and has the first direction as a longitudinal direction thereof. Further the mask has an auxiliary pattern extending in the first direction. The auxiliary pattern is made on each central portion of the first, second, and third patterns on the upper surface of the semiconductor substrate. Forming first, second, and third resist patterns on the resist film follows exposing with the mask. The first to third resist patterns correspond to the first to third patterns on the mask. With respect to forming first to third element-isolation regions with the first to third resist patterns on the semiconductor substrate surface, these element-isolation regions respectively correspond to the first to third resist patterns. The gate electrode extends in the second direction. The gate electrode is formed from the upper surface of the first element-isolation region to the upper surface of the third element-isolation region through an area between the first and third element-isolation regions. Further, the gate element-isolation region is formed from the upper surface of the second element-isolation region to the upper surface of the third element-isolation region through an area between the second and third element-isolation regions.

In the method, the sizes of the first, second, and third patterns may be almost equal to each other.

In the method, the auxiliary pattern may decrease light intensities of the central portions of the first, second, and third patterns.

In the method, the auxiliary pattern may be a rectangular pattern and has the first direction as a longitudinal direction.

In the method, an electrically programmable read-only memory may be used.

In the method, a width of the gate electrode in the first direction may be 0.2 μm or less.

In the method, dimensions of the central portions of the first, second, and third patterns in the second direction may be longer than dimensions of both the end portions of the first, second, and third patterns in the second direction.

In the method, correction patterns respectively including the four corners of the first, second, third patterns may be arranged on the first, second, and third patterns.

According to a second aspect of the invention, in the step of arranging a mask in the method of manufacturing a semiconductor memory element of the first aspect, a mask which has a common first pattern, a common second pattern, the first and second patterns, and a third pattern and in which a plurality of auxiliary patterns respectively extend on the first, second, and third patterns, in the second direction and are arranged such that adjacent intervals in the first direction between the auxiliary patterns become smaller toward the central portions of the patterns is used. The step of forming first, second, and third resist patterns on a resist film, the step of forming first, second, and third element-isolation regions on a semiconductor substrate surface, and the step of forming gate electrodes are the same as those in the method of the first aspect.

In the method of the second aspect, sizes of the first, second, and third patterns may be almost equal to each other.

In the method of the second aspect, the auxiliary patterns may decrease light intensities of the central portions of the first, second, and third patterns.

In the method of the second aspect, an electrically programmable read-only memory may be used.

In the method of the second aspect, a width of the gate electrode in the first direction may be 0.2 μm or less.

In the method of the second aspect, dimensions of the central portions of the first, second, and third patterns in the second direction may be longer than dimensions of both the end portions of the first, second, and third patterns in the second direction.

In the method of the second aspect, correction patterns respectively including the four corners of the first, second, third patterns may be arranged on the first, second, and third patterns.

DESCRIPTION OF THE PREFERRED EMBODIMENTS

The present invention will be described below in detail with respect to the first to fourth embodiments.

First Embodiment

Figure 11:
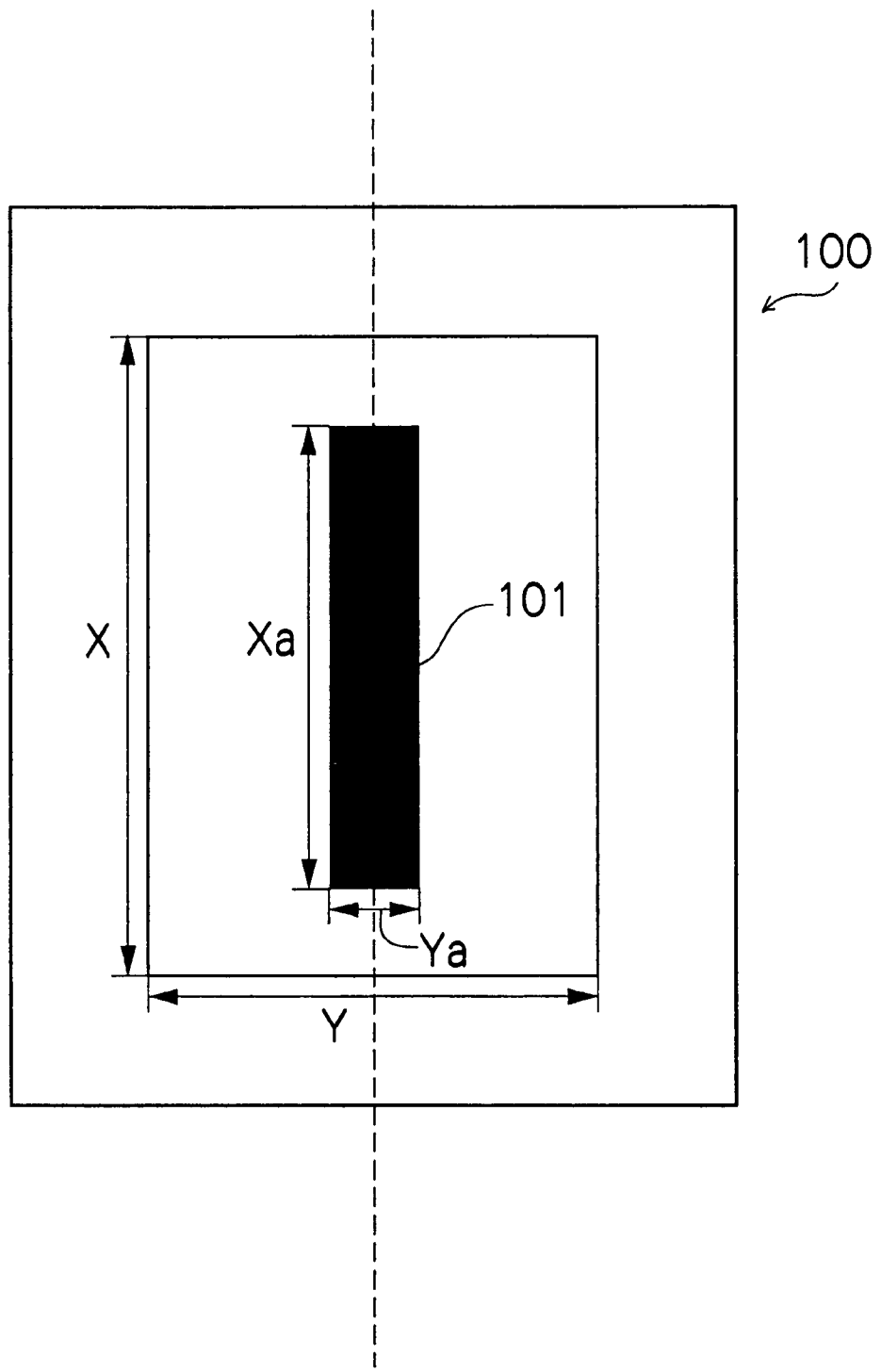
FIG. 11 is a diagram showing a contact pattern according to the first embodiment of the invention.

In a method of manufacturing a semiconductor memory element according to the first embodiment of the invention, a mask to be used has a first pattern, a second pattern, and a third pattern. The first pattern is substantially rectangular with a longitudinal direction set as the first direction on a semiconductor substrate surface on which a resist film is formed. The second pattern is arranged apart from the first pattern in the first direction and substantially rectangular with a longitudinal direction set as the first direction. The third pattern is arranged apart from the first and second patterns in the second direction intersecting the first direction. The third pattern is substantially rectangular with a longitudinal direction set as the first direction. The term "contact pattern" collectively may refer to the first, second, and third patterns. On the mask, an auxiliary pattern extending in the first direction is formed on the central portions of the first, second, and third patterns. A method according to the first embodiment of the invention includes (1) arranging the mask, (2) using the mask to conduct exposure in order to form first, second, and third resist patterns corresponding to the first, second, and third patterns arranged on the mask in the resist film; (3) forming first, second, and third element-isolation regions on the semiconductor substrate surface corresponding to the first, second, and third resist patterns by using the first, second, and third resist patterns; (4) forming a gate electrode extending in the second direction; and (5) forming a gate electrode. The gate electrode is to extend in the second direction. The gate electrode is formed from an upper surface of the first element-isolation region to an upper surface of the third element-isolation region through an area between the first and third element-isolation regions and from an upper surface of the second element-isolation region to the upper surface of the third element-isolation region through an area between the second and third element-isolation regions. As shown in FIG. 11, a rectangular auxiliary pattern 101 is formed at the central portion of a contact pattern 100. The longitudinal direction of the auxiliary pattern 101 is parallel to the longitudinal direction of the contact pattern 100.

Figure 9:
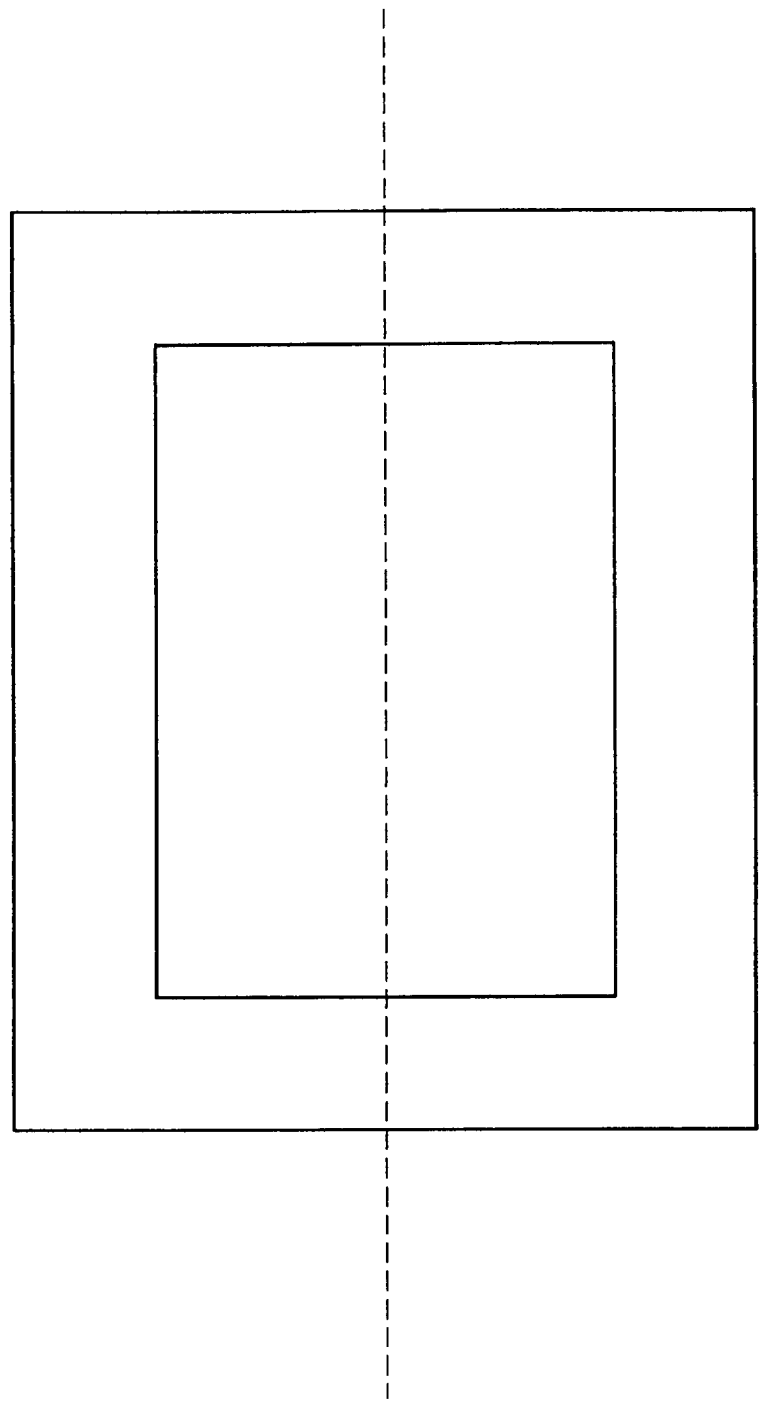
FIG. 9 is a diagram showing a mask conventionally used.

When the resist patterns are formed by using the contact patterns, the light intensity of the central portion of the contact pattern is decreased by the auxiliary pattern 101, and the light intensity of an end portion of the contact pattern becomes high. Since the light intensity of the end portion is high even though a focus varies, the variation of the light intensity of the end portion becomes small. Therefore, in comparison with the case in which the conventional mask shown in FIG. 9 is used, a variation in dimension can be decreased with respect to a variation in focus.

In this case, the "auxiliary pattern" is a pattern to reduce the light intensity of the central portion of the contact pattern, and means a pattern which does not appear on the exposed resist pattern.

In particular, in terms of the decrease of the light intensity of the end portion, the auxiliary pattern may be a pattern which decreases the light intensities of the central portions of the first, second, and third patterns.

The sizes of the first, second, and third patterns may be almost equal to each other. More specifically, as the pattern size, about 0.8 $\mu$m in the first direction and about 0.2 $\mu$m in the second direction may be set. This size is common in the following embodiments.

The contact pattern in arranging a mask may have the following configuration. For example, when the contact pattern is planarly viewed from the above, the second pattern is arranged below the first pattern, and the third pattern is arranged in the widthwise direction of the second pattern.

Figure 12:
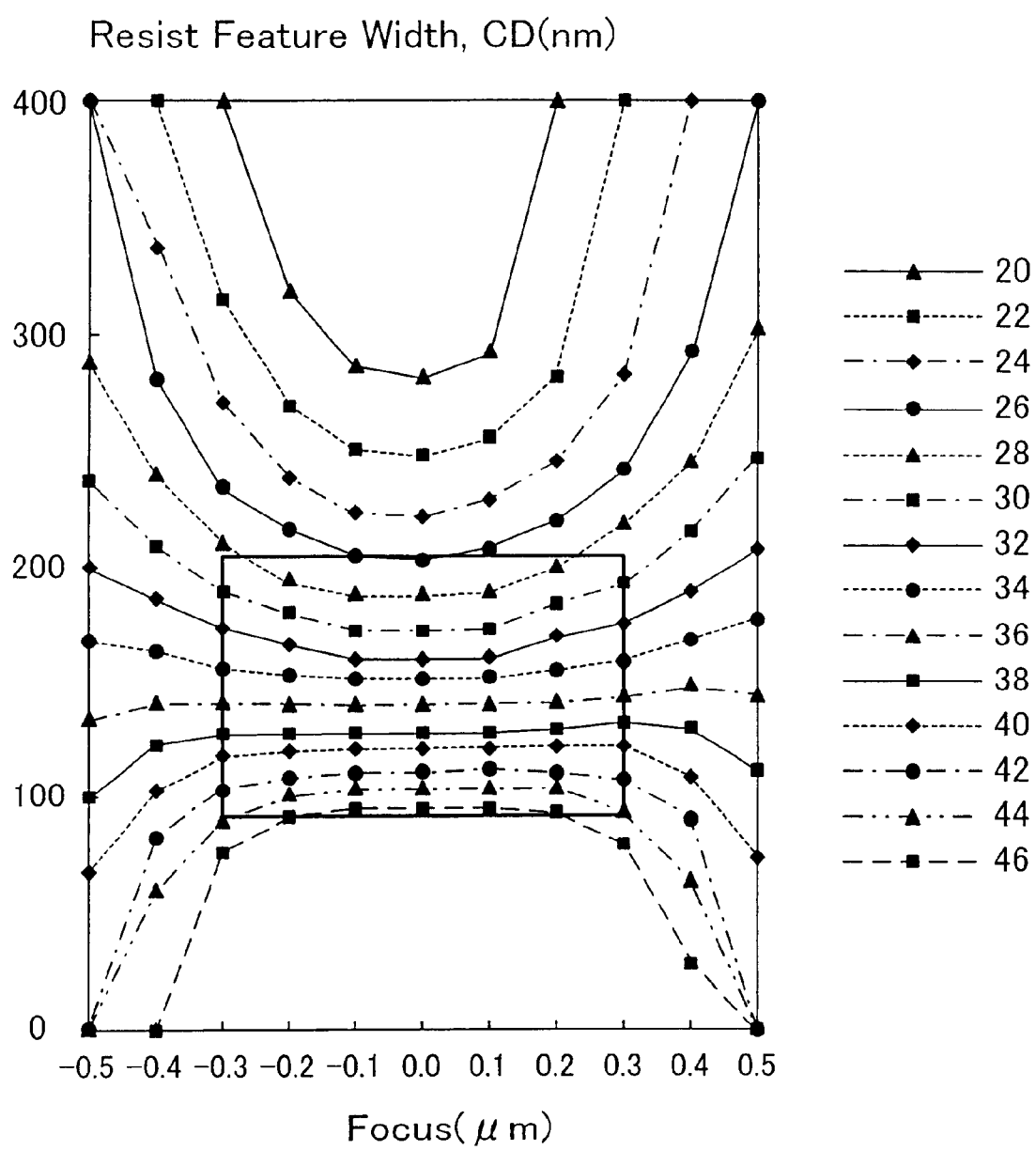
FIG. 12 is a graph showing a focus exposure distribution according to the first embodiment of the invention.

FIG. 12 shows a focus exposure distribution obtained when simulation for forming a resist pattern is performed by using the contact pattern shown in FIG. 11. The conditions of the simulation are the same as those of the case in FIG. 10. The conditions are common in the following embodiments.

Figure 10:
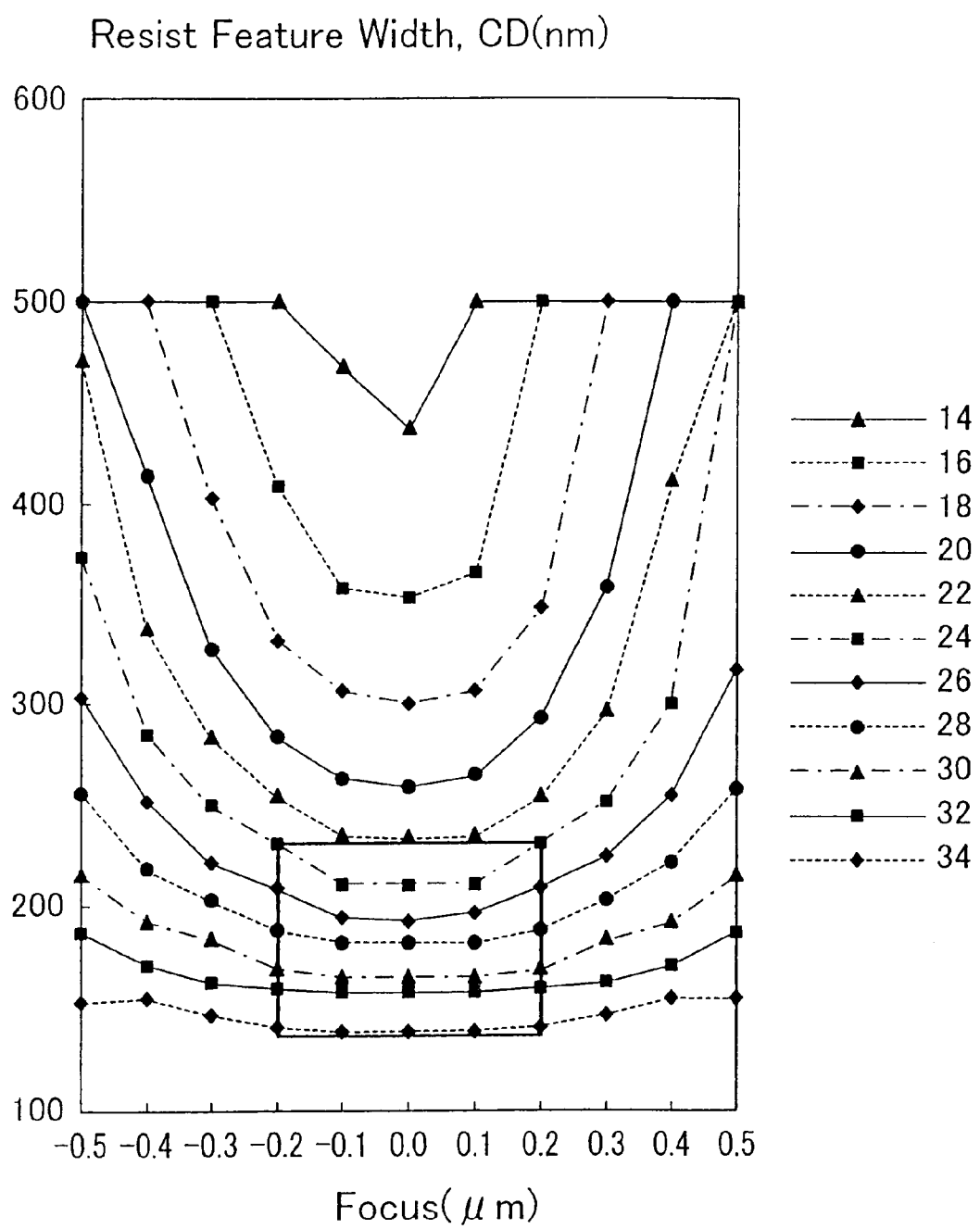
FIG. 10 is a graph showing a focus exposure distribution obtained by a mask conventionally used.

As is apparent from FIG. 12, a variation in dimension is small with reference to a focus in comparison with the case shown in FIG. 10, and a variation in dimension is also small with reference to exposure energy. This is because an energy level in the case in FIG. 12 is higher than an energy level in the case in FIG. 11 when the widths are equal to each other. In an illuminance distribution, it is understood that the highest light intensity cannot be obtained on the central portion of the contact pattern and that the light intensity of the end portion is high.

As described above, it is confirmed that the light intensity which is uniform more than that of the conventional mask described above and a variation in dimension is small with reference to a variation in focus.

The auxiliary pattern 101 is substantially rectangular and arranged on the central portion of the contact pattern 100. The auxiliary pattern 101 consists of, e.g., Kr and is a portion serving as a resist pattern after a photolithography process.

A length Xa in the longitudinal direction may be ½ to ⅕ of a length X in the internal longitudinal direction of the contact pattern 100. In addition, the length Xa may be ¼ to ⅕ of the length X.

When the length Xa is set within the above range, the auxiliary pattern 101 can be eliminated after the photolithography process.

On the drawing of the auxiliary pattern 101, a length Ya in the widthwise direction may be ⅓ to ¹⁄₁₀ of a length Y in the internal widthwise direction of the contact pattern 100. In addition, the length Ya may be ⅕ to ⅐ of the length Y.

When the length Ya is set within the range, the auxiliary pattern 101 can be eliminated after the photolithography process.

The width of the finally formed gate electrode in the first direction may be 0.2 $\mu$m or less. The width may be about 0.16 $\mu$m. This is common in the second to fourth embodiments (will be described later).

The distances of the central portions of the first, second, and third patterns in the second direction may be longer than the distances of both the end portions of the first, second, and third patterns in the second direction. When the distances of the central portions are longer than the distance of the end portions, pattern shapes near the central portions of patterns deteriorated by the auxiliary pattern arranged on the central portions of the patterns can be corrected. Therefore, the shape of each pattern can be made more square.

Figure 1:
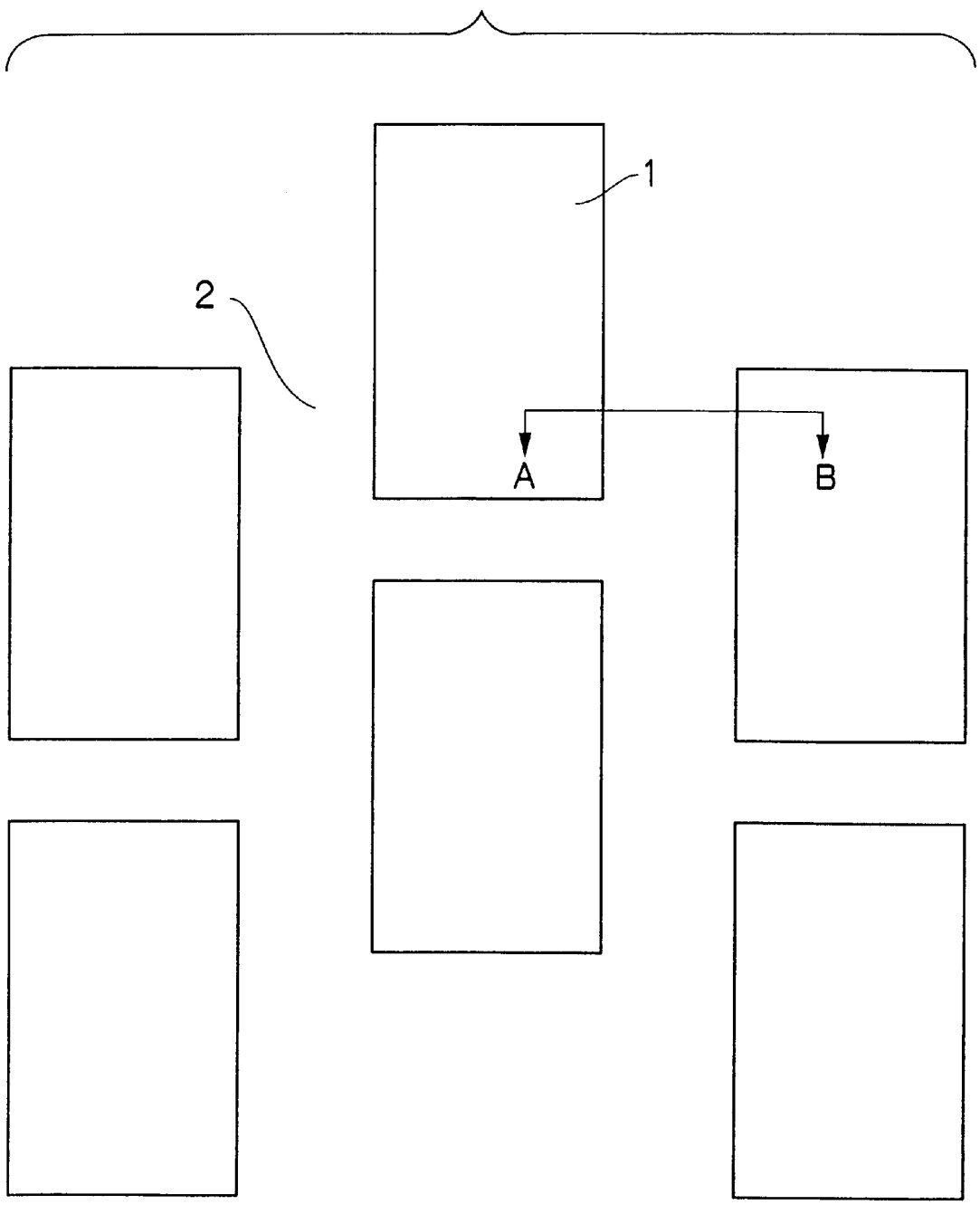
FIG. 1 is a diagram showing a pattern obtained before the pattern is transferred by photolithography.
Figure 2:
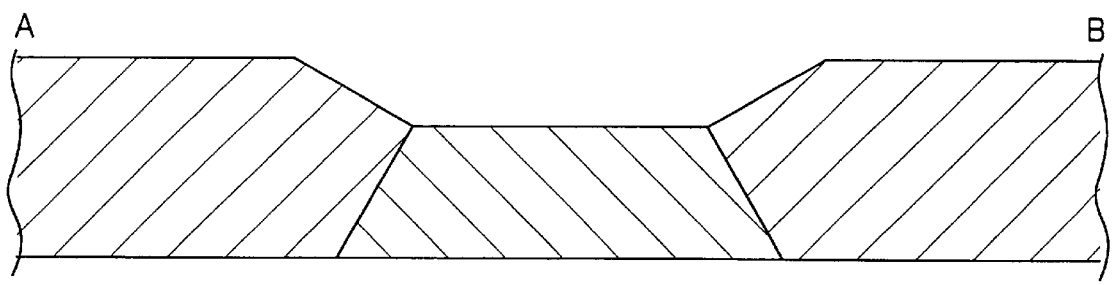
FIG. 2 is a sectional view along an A–B line in FIG. 1.
Figure 3:
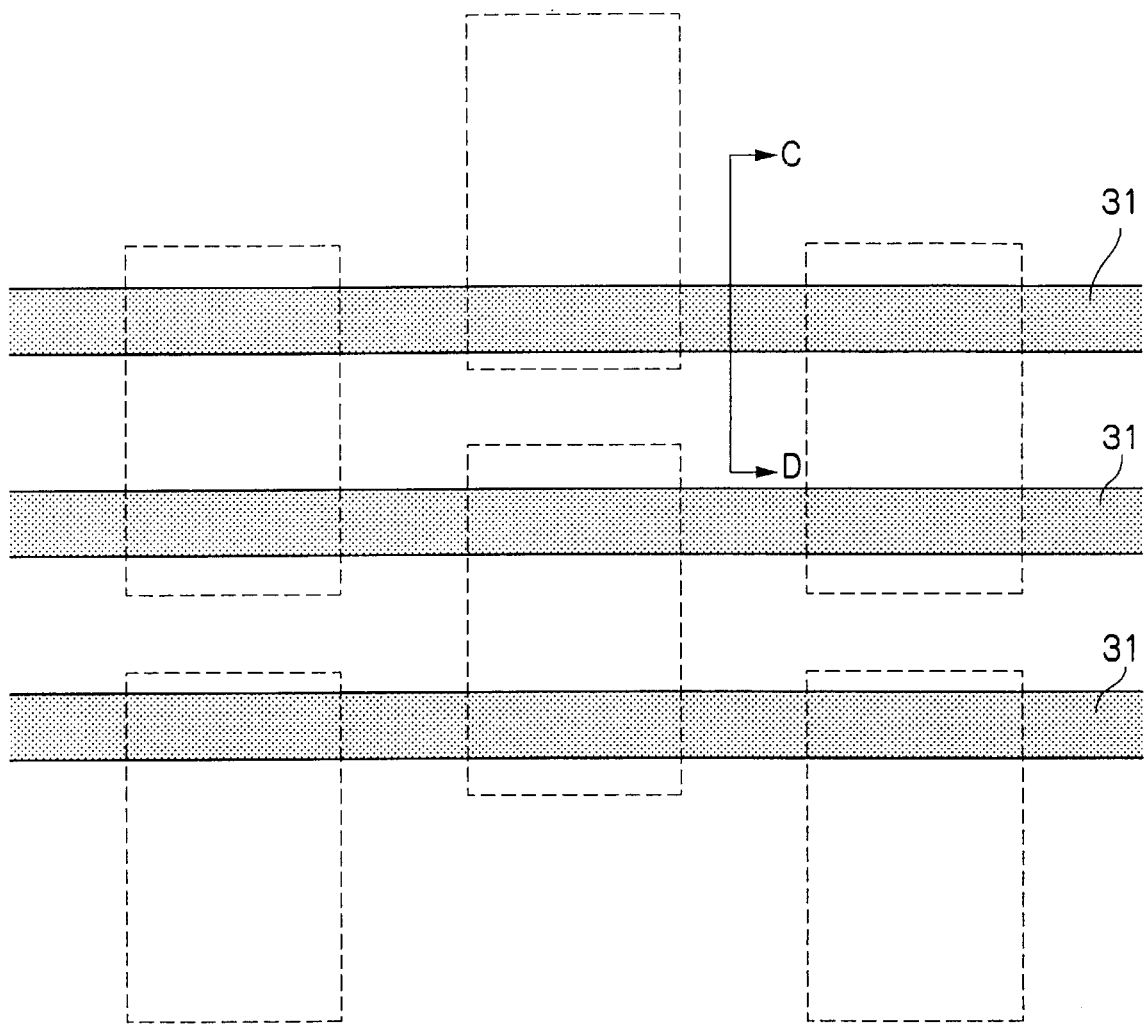
FIG. 3 is a diagram showing a state in which a mask is formed when a pattern is transferred by photolithography.

As described above, the contact patterns in FIG. 11 which are arranged in the form of a lattice to have the same necessary memory size as that of FIG. 1 are used, and a resist coating process, an exposure process, a development process, and the like are performed.

In this manner, a resist pattern for forming an element-isolation region is formed in a predetermined element-isolation forming region on a semiconductor substrate on which a resist film.

Figure 4:
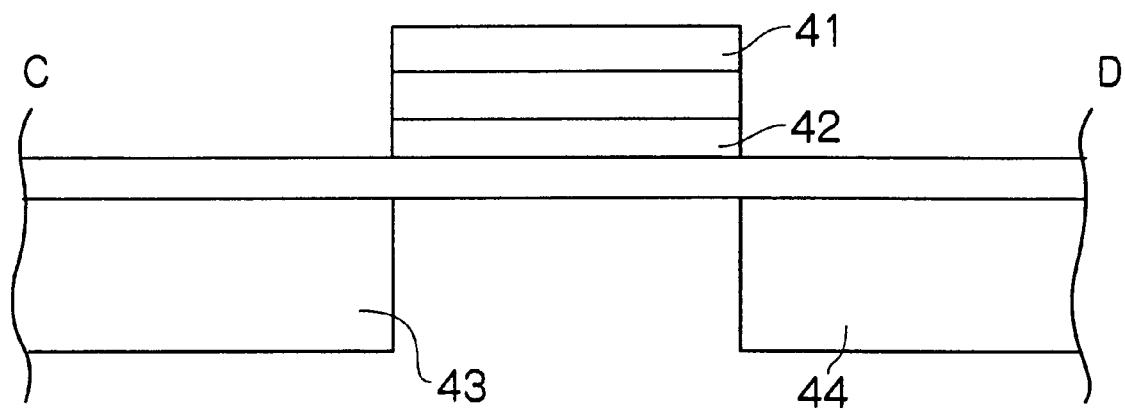
FIG. 4 is a sectional view along a C–D line in FIG. 3.

Thereafter, when processes such as etching and ion implantation are performed, a semiconductor memory in which a control gate, a floating gate, a source, and a drain are formed as shown in FIG. 4 is fabricated.

Figure 5:
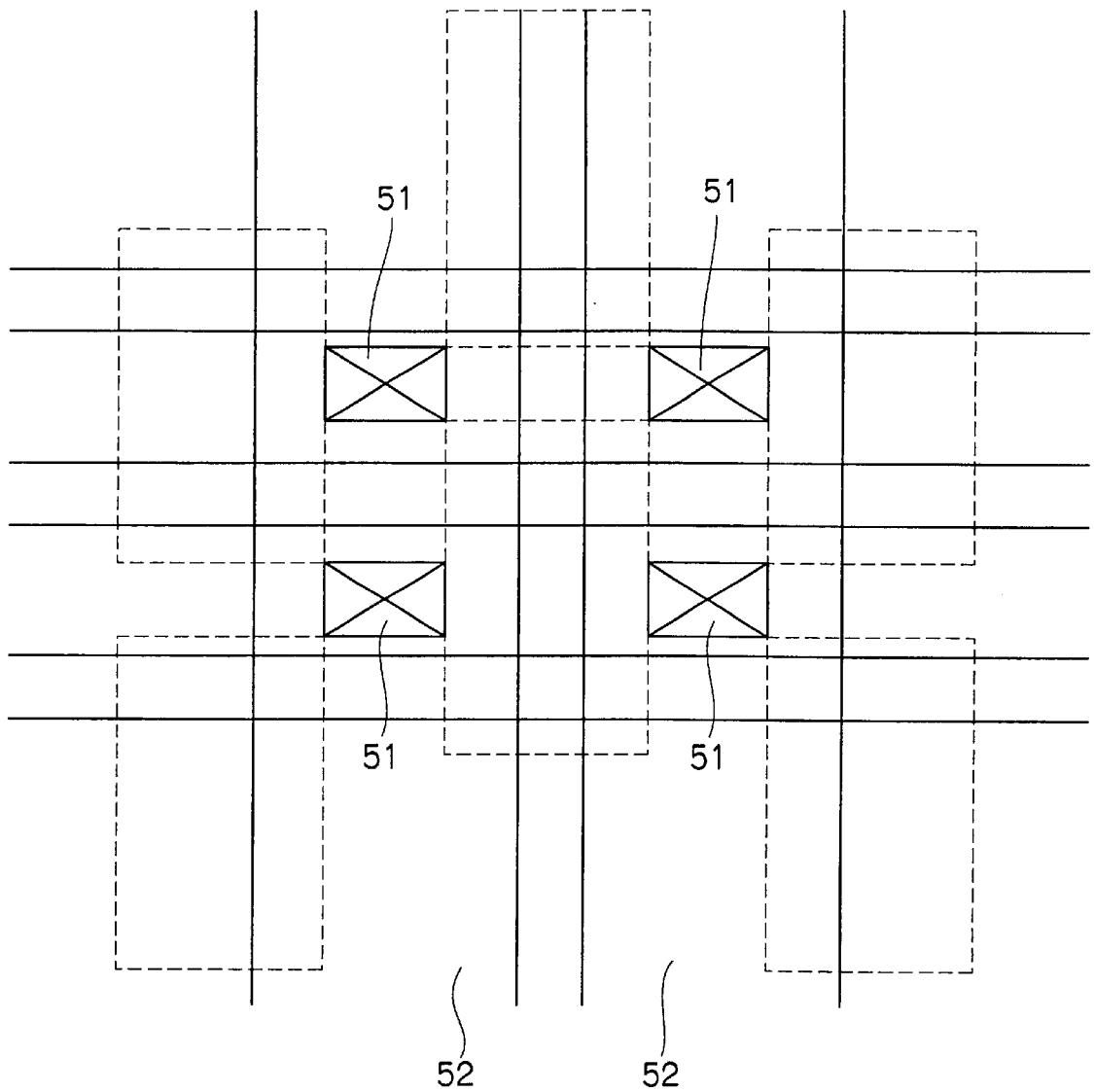
FIG. 5 is a diagram showing a state in which contacts and metal wires are arranged.
Figure 6:
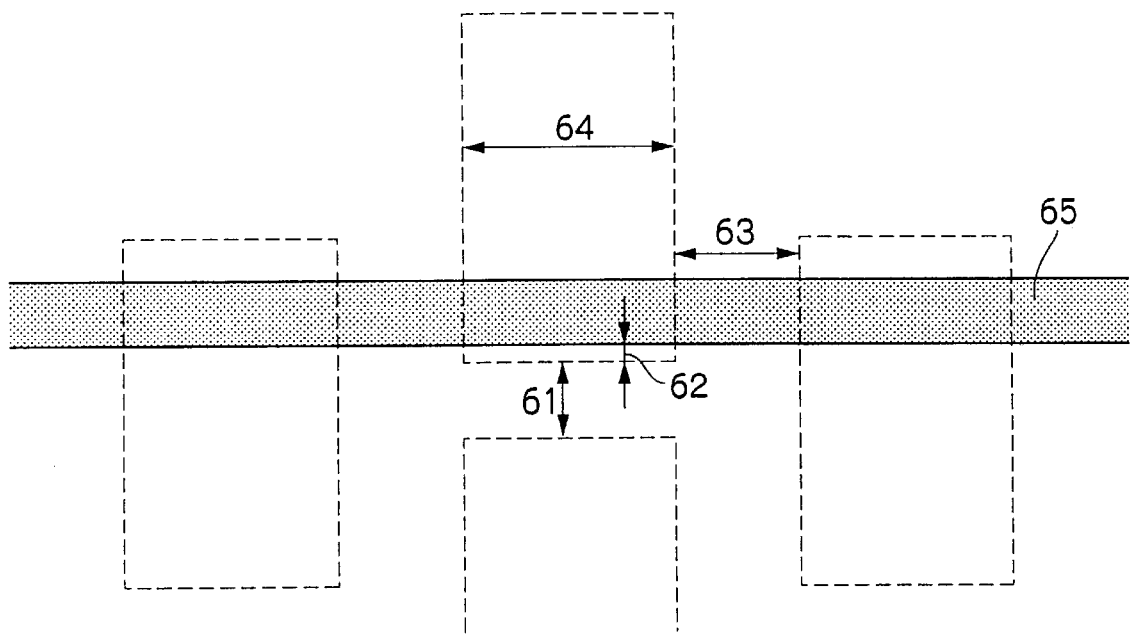
FIG. 6 is a diagram for explaining patterning.
Figure 7:
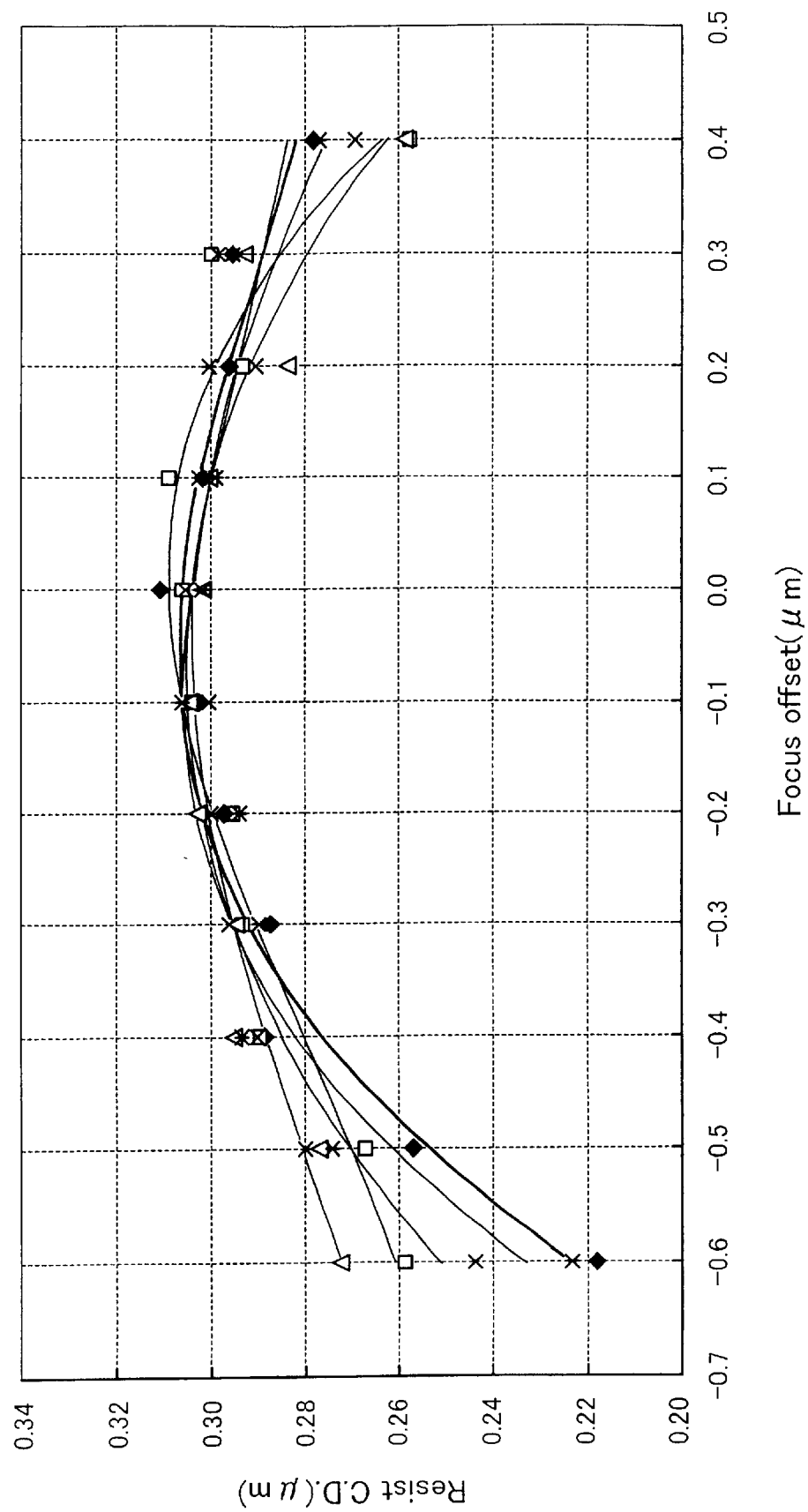
FIG. 7 is a graph showing a variation in dimension at a portion indicated by reference numeral 64 with respect to a focus.
Figure 8:
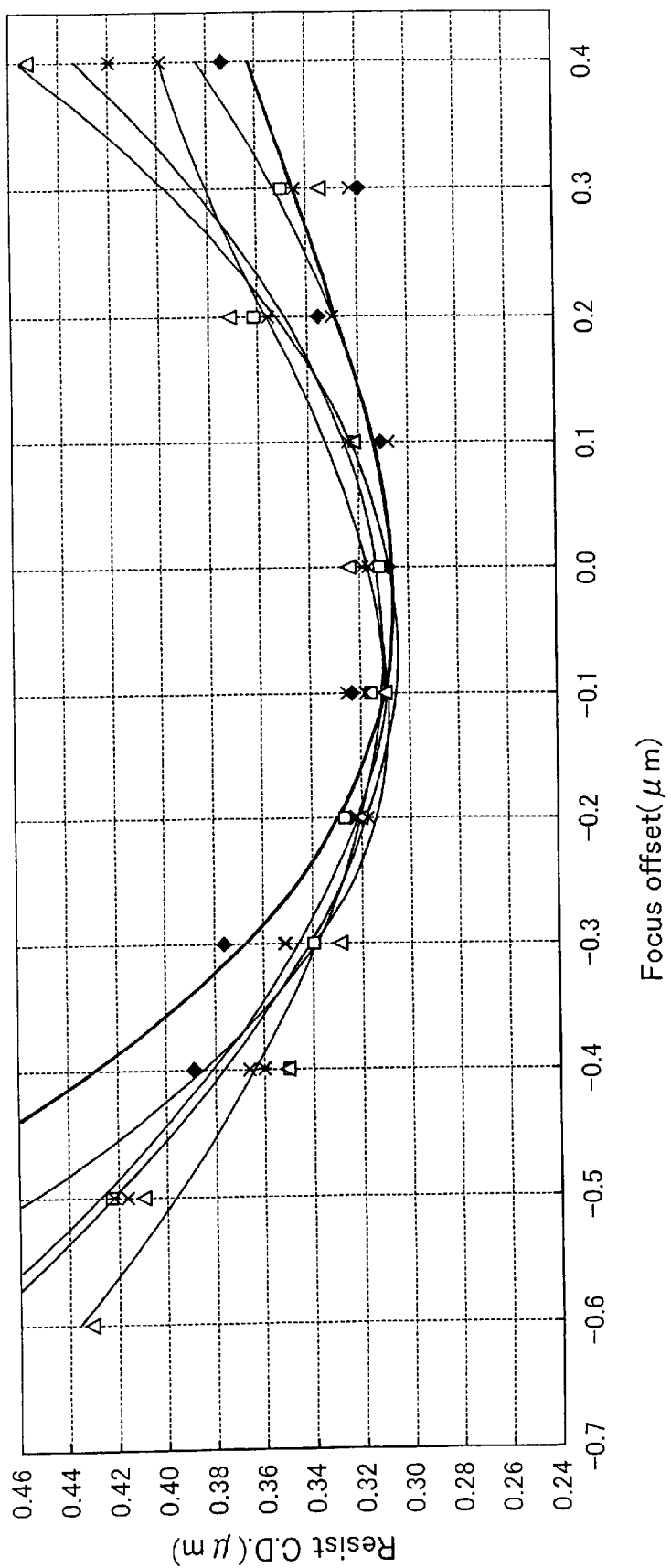
FIG. 8 is a graph showing a variation in dimension at a portion indicated by reference numeral 61 with respect to a focus.

Thereafter, film application, photolithography, and the like are performed. As shown in FIG. 5, a contact 51 and a metal wiring layer 52 serving as word lines are formed to make it possible to select a cell. This is common in the second to fourth embodiments (will be described later).

In this manner, according to the method of manufacturing a semiconductor memory element in this embodiment, a variation in dimension in the first direction in which the pattern 1 extends can be suppressed although the variation in dimension cannot be easily controlled by the conventional method. Therefore, memory cells can be reduced while securing margins to the above-mentioned source line resistor and the control gate.

Second Embodiment

Figure 13:
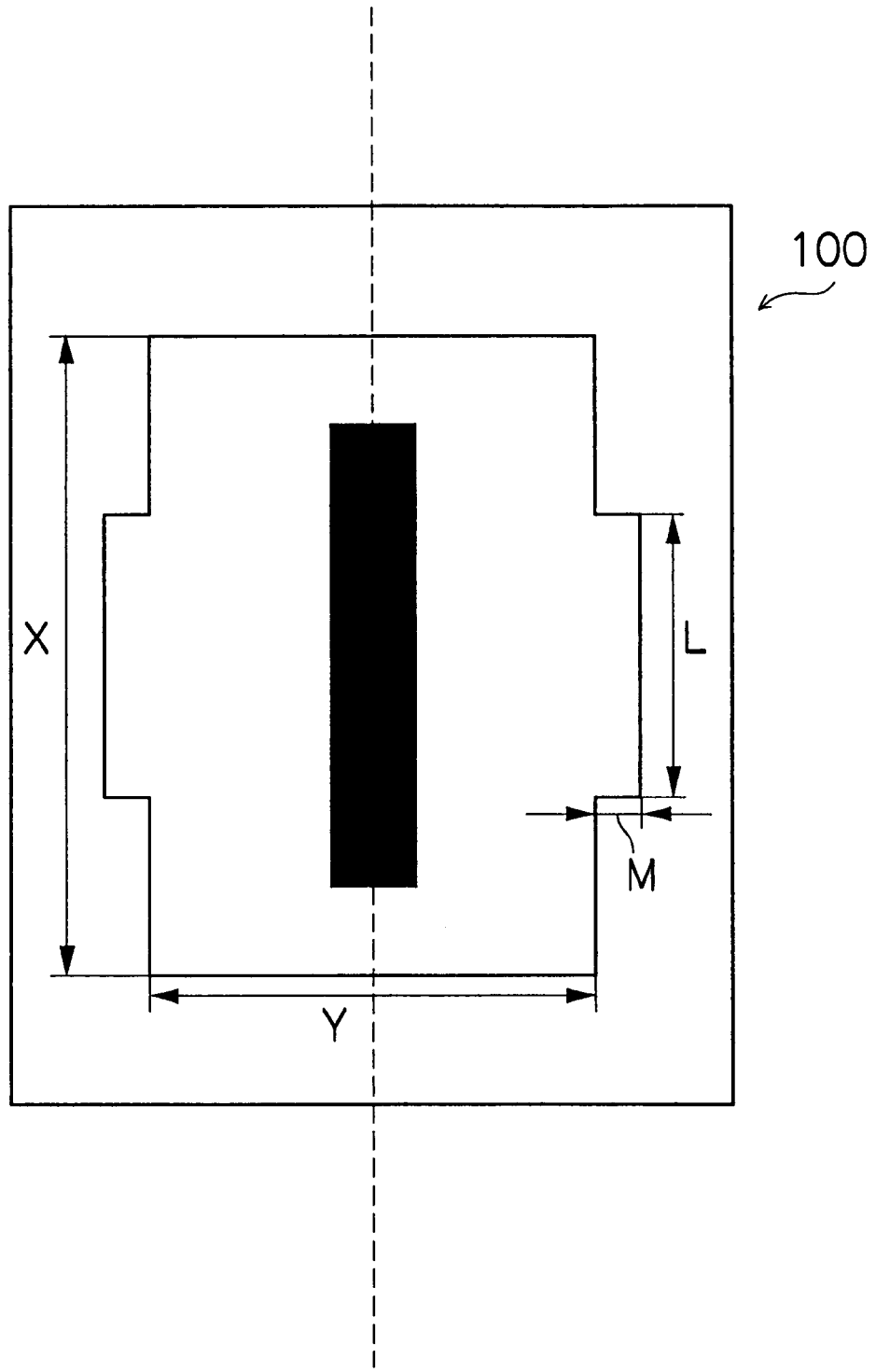
FIG. 13 is a diagram showing a contact pattern according to the second embodiment of the invention.

As shown in FIG. 13, the second embodiment has the same configuration as that of the first embodiment except that recessed portions are formed both the sides of a contact pattern 100 in the drawing.

In the first embodiment, a decrease in width of the central portion which is confirmed by an illuminance distribution may occur. Therefore, when the recessed portions are formed to increase the light intensity of the central portion of a rectangular contact pattern, the decrease in width can be prevented, and a light intensity distribution can be made more uniform.

A length L in the longitudinal direction of the recessed portion may be ⅕ to ⅓ of a length X in the internal longitudinal direction of the contact pattern 100. In addition, the length L may be ¼ to ⅕ of the length X.

When the length L is set within the above range, the light intensity to the recessed portion can be corrected.

A length M in the widthwise direction may be 1/10 to ¼ of a length Y in the internal widthwise direction of the contact pattern 100. In addition, the length M may be ⅙ to ¼ of the length Y.

When the length M is set within the range, the light intensity to the recessed portion can be corrected.

Figure 14:
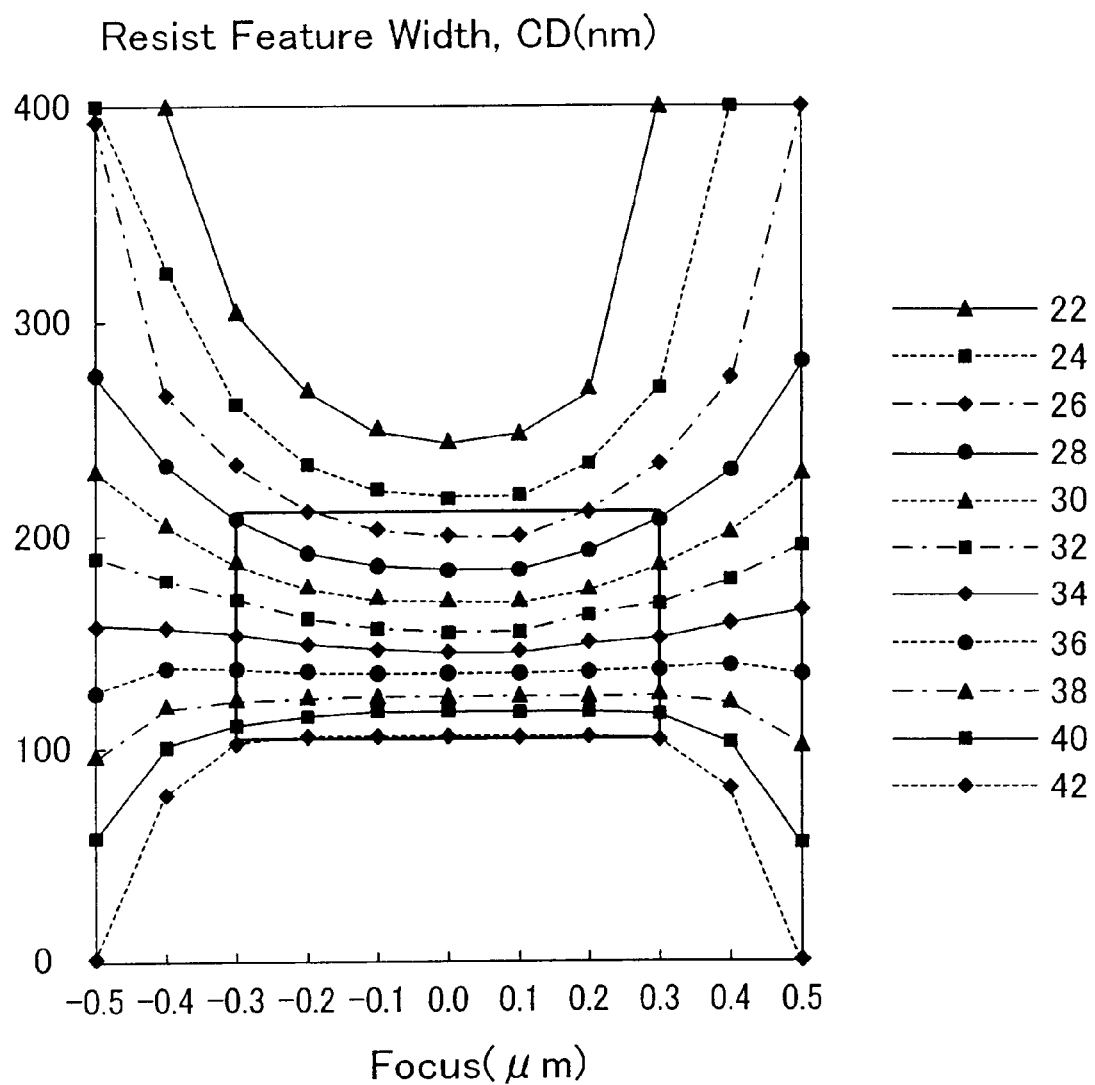
FIG. 14 is a graph showing a focus exposure distribution according to the second embodiment of the invention.

FIG. 14 shows a focus exposure distribution obtained when simulation for forming a resist pattern is performed by using the contact pattern shown in FIG. 13.

As in the case in FIG. 12, it is understood a focus exposure distribution does not change even though an auxiliary pattern is formed at the central portions. In an illuminance distribution, it is understood that a decrease in width of the central portion of the rectangular contact pattern does not occur and that the central portion is straight.

As described above, it can be confirmed that a light intensity is made uniform more than that of the conventional mask, that the decrease in width of the central portion does not occur, and that a variation in dimension decreases with reference to a variation in focus.

Third Embodiment

Figure 18:
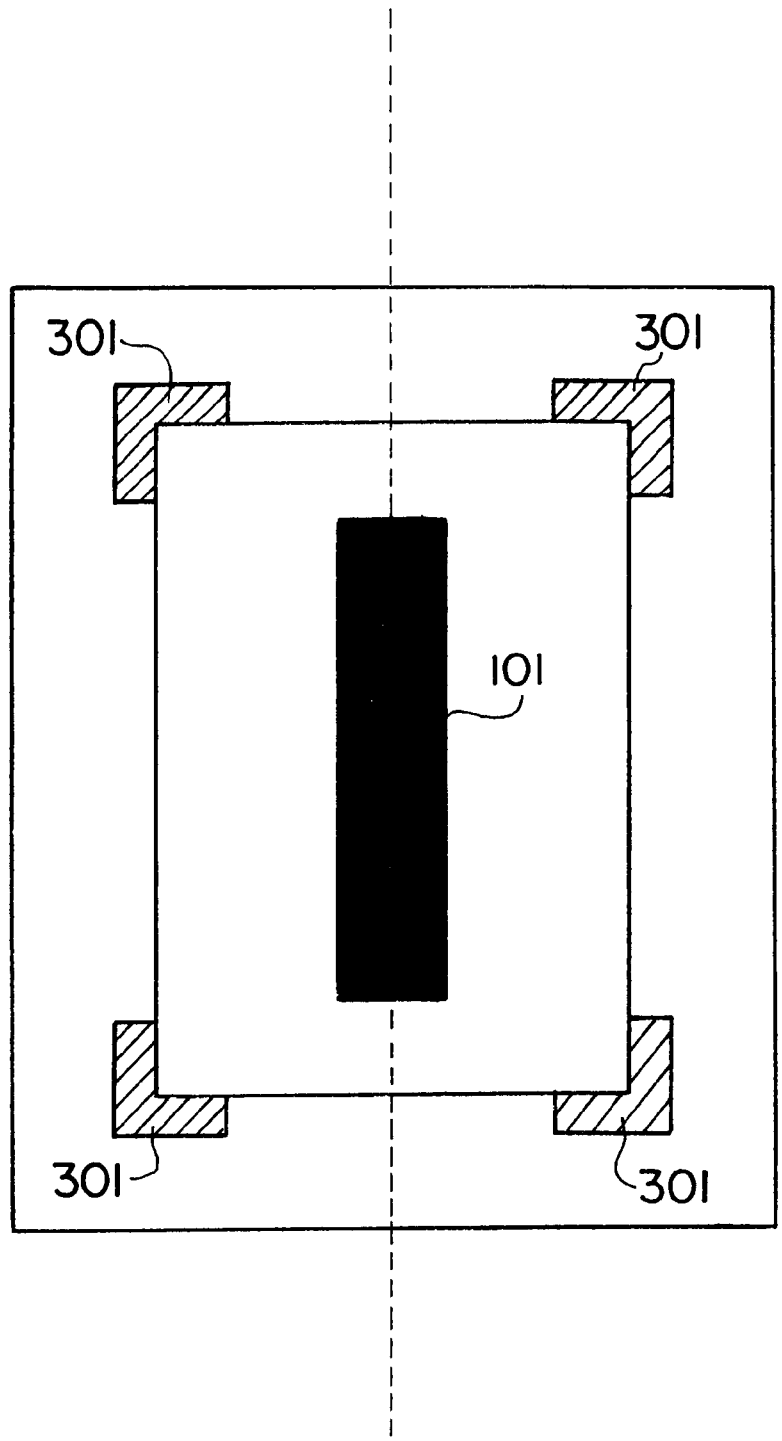
FIG. 18 is a diagram showing a contact pattern obtained when a correction pattern is formed.

A mask in a method of manufacturing a semiconductor memory element according to the third embodiment of the invention has the first, second, and third patterns which are described with reference to the mask in the first embodiment. A plurality of auxiliary patterns which extend on the first, second, and third patterns, respectively, in a second direction and which are arranged such that adjacent intervals in the first direction between the auxiliary patterns become small toward the central portions of the patterns are formed on the mask. The method of the third embodiment includes (1) arranging the mask, the step of forming first, second, and third resist patterns on the resist film, the step of forming first, second, and third element-isolation regions, and (2) forming gate electrodes. Other contents except for arranging the mask are common in the first and third embodiments. As shown in FIG. 18, inside the contact pattern 100, a plurality of auxiliary patterns 201 extending in the longitudinal and longitudinal directions of the contact pattern 100 are formed.

The accuracy of a light intensity can be regulated by the auxiliary patterns. Therefore, a variation in dimension can be decreased with respect to a variation in focus.

In this case, the auxiliary pattern may be a synonymous for the pattern, which decreases the light intensity of the central portion of the contact pattern and does not appear on an exposed resist pattern.

The intervals between the auxiliary patterns 201 may be decreased toward the center. In this manner, when the auxiliary patterns 201 are arranged by minimum lines of mask drawing, dependence on exposure energy is eliminated. Therefore, the light intensity distribution can be made more uniform.

Figure 15:
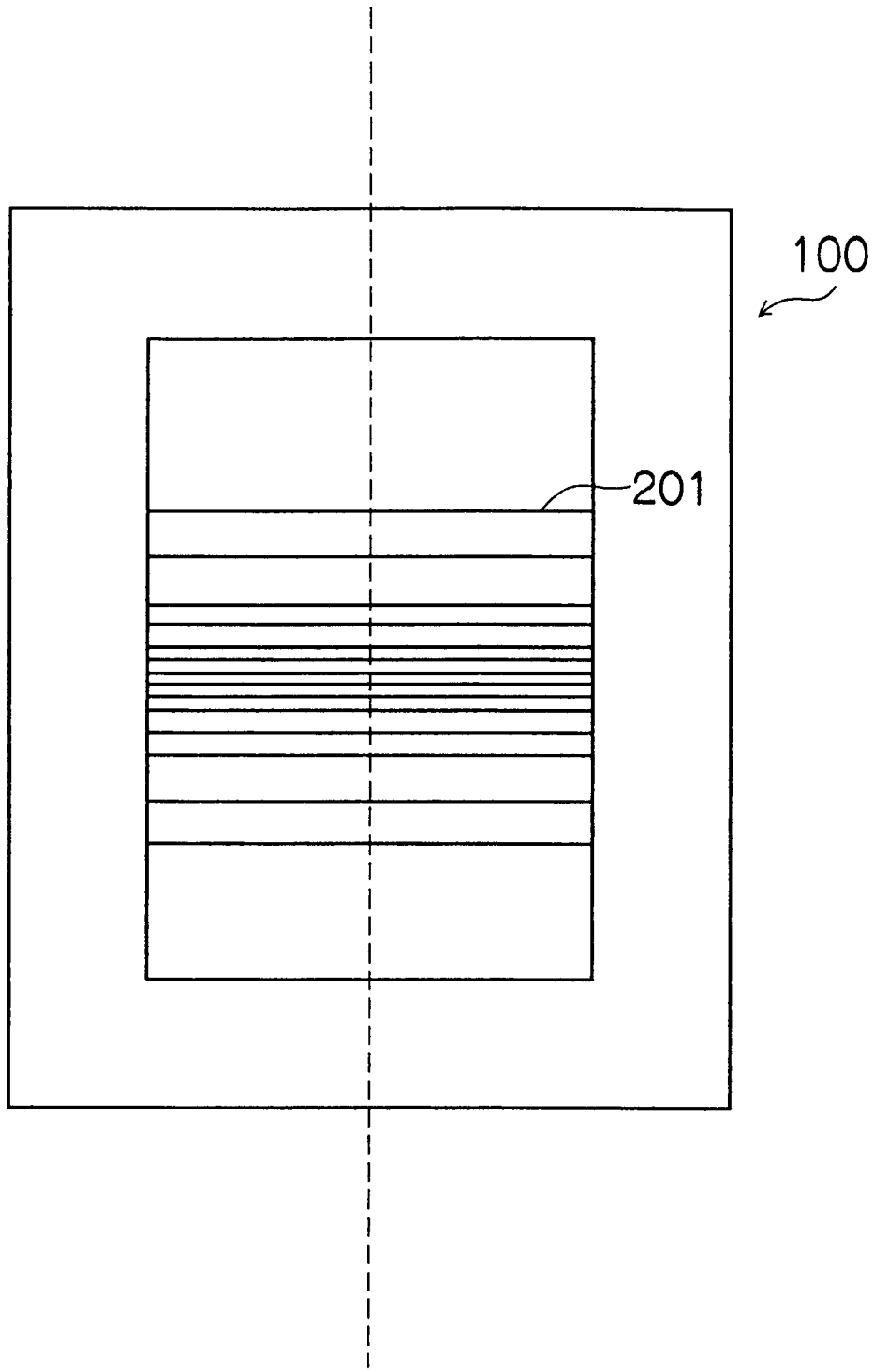
FIG. 15 is a diagram showing a contact pattern according to the third embodiment of the invention.

In FIG. 15, the width (length in the longitudinal direction on the drawing) of the slit (auxiliary pattern 201) is set to be 0.02 μm. However, in this embodiment, the width is not limited to this value. The width may be substantially the minimum size of the mask drawing.

When the width is set within the range, the light intensity of the rectangular contact pattern can be corrected without generating residual of the auxiliary patterns. In FIG. 15, two auxiliary patterns 201 are arranged at an interval of 0.02 μm at the central portion. Next two auxiliary patterns 201 are arranged at intervals of 0.04 μm outside each of the first two patterns. Next two third auxiliary patterns 201 are arranged at intervals of 0.08 μm outside each of the second patterns. Finally, two fourth auxiliary patterns 201 are arranged at intervals of 0.01 μm outside each of the third patterns.

With this configuration, the effect described above is sufficiently achieved. However, in this embodiment, the intervals between the auxiliary patterns 201 are not limited to the above-mentioned values.

Figure 16:
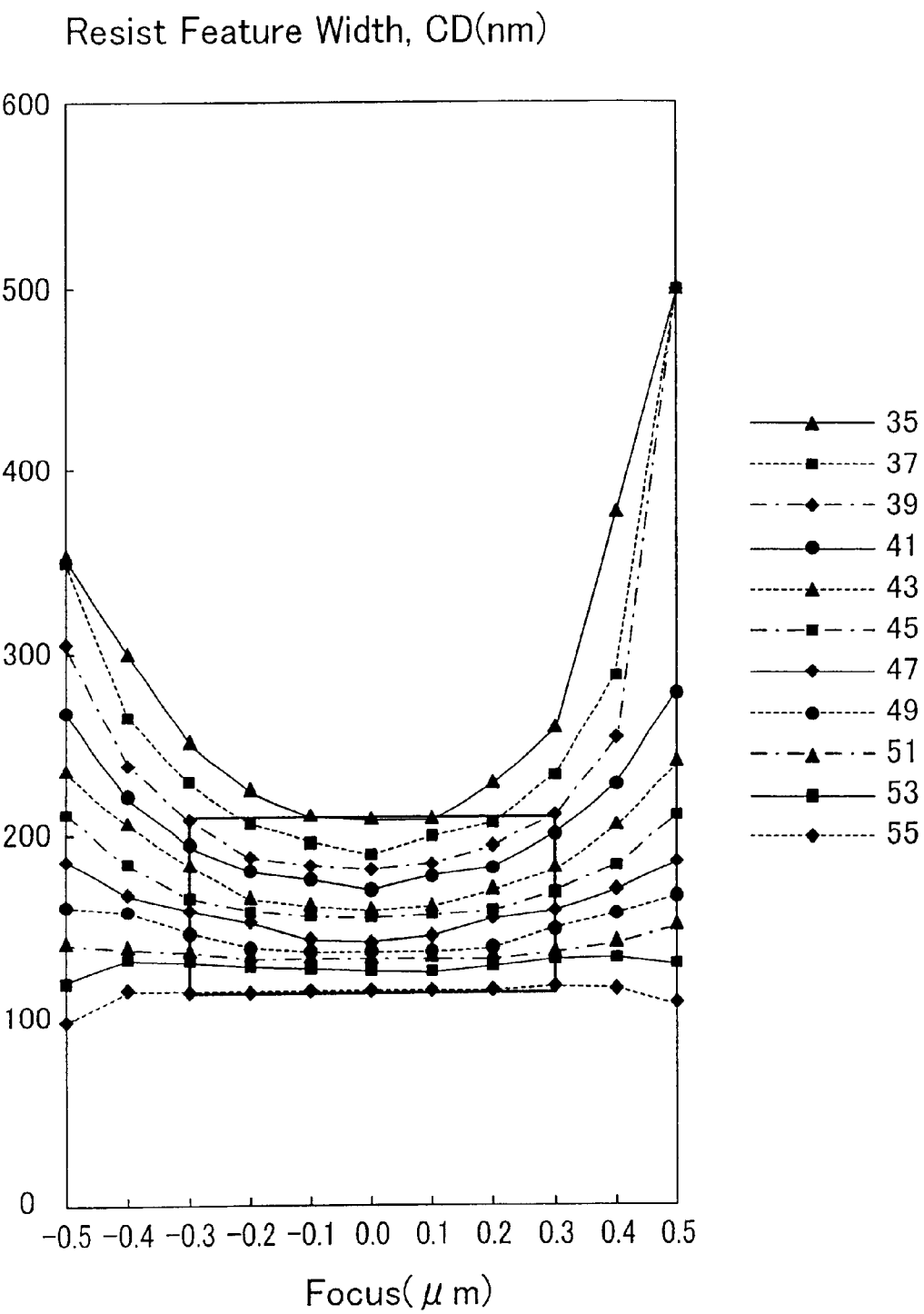
FIG. 16 is a graph showing a focus exposure distribution according to the third embodiment of the invention.

FIG. 16 shows a focus exposure distribution obtained when simulation for forming a resist pattern is performed by using the contact pattern shown in FIG. 15.

As is apparent from FIG. 16, a variation in dimension with reference to a focus and a variation in dimension with reference to an amount of exposure are made uniform more than those in FIG. 10. In addition, in an illuminance distribution, an illuminance in the rectangular contact pattern is lower than that of the prior art, and an illuminance of an end portion is high and almost equal to that of the above embodiments.

As described above, it can be confirmed that the light intensity is made uniform more than that of the conventional mask and that the variation in dimension with reference to the variation in focus becomes small.

Fourth Embodiment

Figure 17:
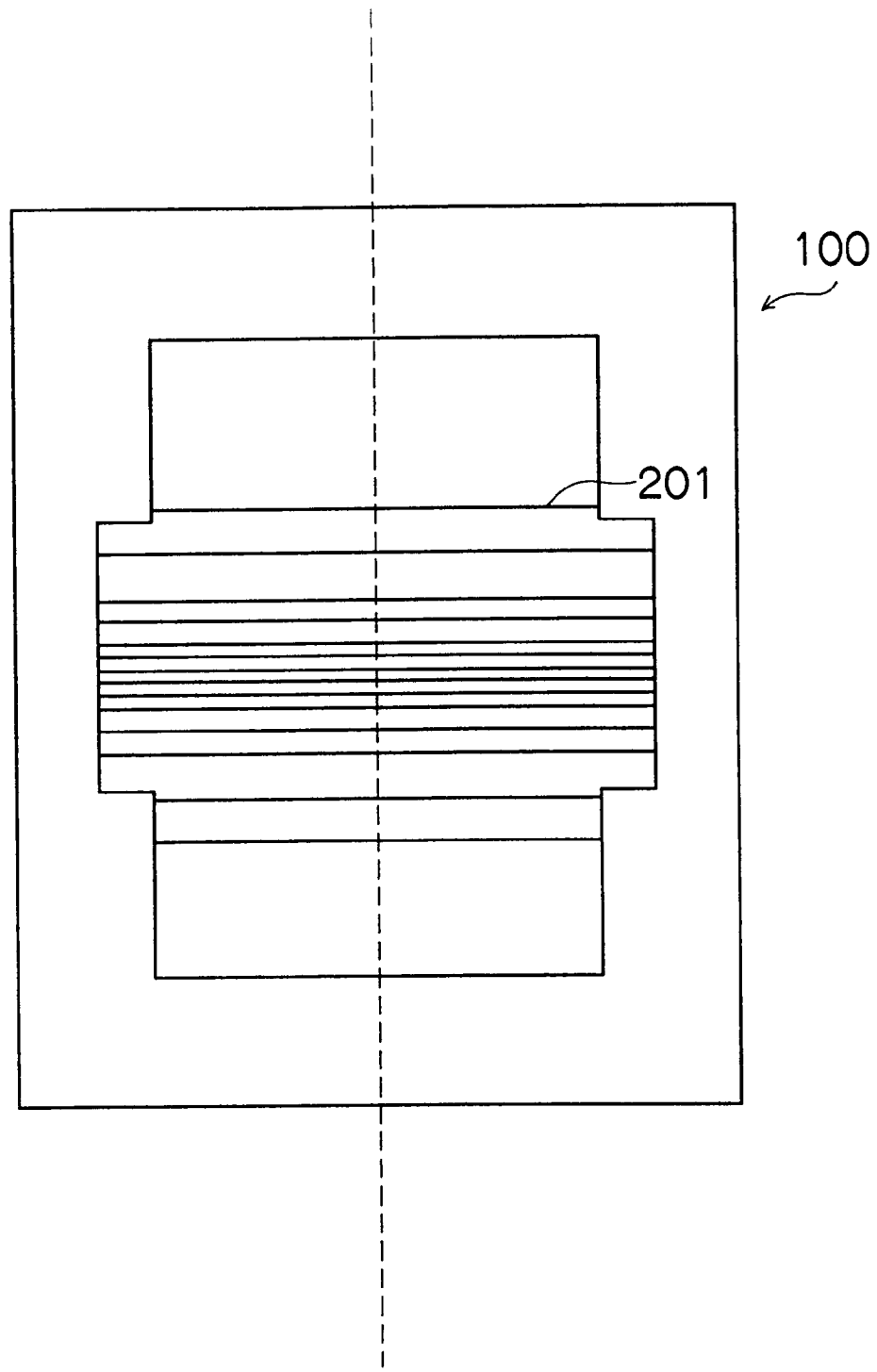
FIG. 17 is a diagram showing a contact pattern according to the fourth embodiment of the invention.

As shown in FIG. 17, the fourth embodiment has the same configuration as that of the third embodiment except recess. The recess is formed both the sides of a contact pattern 100 on the drawing. The recess is the same as that in the second embodiment is used.

With this configuration, while the light intensity distribution can be effectively uniformed as in the third embodiment, a decrease in width can be efficiently suppressed as in the second embodiment.

The invention has been described above by the first to fourth embodiments. The method of forming a resist pattern according to the invention is mainly applied to a method of forming a resist pattern for a read-only memory.

In this case, the read-only memory means a read-only memory which is generally considered in the semiconductor business. More specifically, the semiconductor memory is an EPROM, an EEPROM, a flash memory, or the like.

With respect to the first to fourth embodiments, the method of manufacturing a semiconductor memory element has been explained where a resist pattern forming mask (contact pattern) is used for forming an element-isolation region as shown in FIG. 11, 13, 15, or 17. However, the invention is not limited to the application to the contact patterns having the shapes shown in FIGS. 11, 13, 15, and 17. The method of manufacturing a semiconductor memory element according to the invention is also applicable to a contact pattern which a correction pattern is provided for performing optical proximity correction (OPC) at each of the four corners of the contact pattern as shown in FIG. 11, 13, 15, and 17. In this case, the same effect as described above can be obtained.

As a specific example, FIG. 18 shows a configuration in which correction pattern 301 is formed at each corner of the contact pattern of FIG. 11.

According to the invention, a method of manufacturing a semiconductor memory element can be provided, which can decrease a dimensional variation against a focus variation.

What is claimed is:

1. A method of manufacturing a semiconductor memory element comprising:

arranging, on an upper surface of a semiconductor substrate on which a resist film is formed, a mask which includes a first rectangular pattern having a first direction as a longitudinal direction thereof, a second rectangular pattern arranged apart from the first pattern in the first direction and having the first direction as a longitudinal direction thereof, and a third rectangular pattern arranged apart from the first and second patterns in a second direction intersecting the first direction, and having the first direction as a longitudinal direction thereof, and in which an auxiliary pattern extending in the first direction is formed on a central portion of each of the first, second, and third patterns;

using the mask to conduct exposure in order to form first, second and third resist patterns on the resist film, the first, second and third resist patterns respectively corresponding to the first, second and third patterns arranged on the mask;

using the first, second, and third resist patterns, on the semiconductor substrate surface, to form first, second, and third element-isolation regions respectively corresponding to the first, second, and third resist patterns; and forming a gate electrode, which extends in the second direction and is formed from an upper surface of the first element-isolation region to an upper surface of the third element-isolation region through an area between the first and third element-isolation regions and from an upper surface of the second element-isolation region to an upper surface of the third element-isolation region through an area between the second and third element-isolation regions.

2. A method of manufacturing a semiconductor memory element according to claim 1, wherein the first, second, and third patterns include almost equal size with each other.

3. A method of manufacturing a semiconductor memory element according to claim 1, wherein the auxiliary pattern decreases light intensities of central portions of the first, second, and third patterns.

4. A method of manufacturing a semiconductor memory element according to claim 1, wherein the auxiliary pattern is substantially rectangular and has the first direction as a longitudinal direction thereof.

5. A method of manufacturing a semiconductor memory element according to claim 1, wherein the method is applicable to an electrically programmable read-only memory.

6. A method of manufacturing a semiconductor memory element according to claim 1, wherein a width of the gate electrode in the first direction is not more than 0.2 µm.

7. A method of manufacturing a semiconductor memory element according to claim 1, wherein dimensions of the central portions of the first, second, and third patterns in the second direction are longer than dimensions of both the end portions of the first, second, and third patterns in the second direction.

8. A method of manufacturing a semiconductor memory element according to claim 1, wherein correction patterns respectively including the four corners of the first, second, third patterns are respectively arranged on the first, second, and third patterns.

9. A method of manufacturing a semiconductor memory element according to claim 5, wherein the read-only memory includes an EPROM, an EEPROM, and a flash memory.

10. A method of manufacturing a semiconductor memory element according to claim 6, wherein a width of the gate electrode in the first direction is about 0.16 µm.

11. A method of manufacturing a semiconductor memory element comprising:

arranging, on an upper surface of a semiconductor substrate on which a resist film is formed, a mask which includes a first rectangular pattern having a first direction as a longitudinal direction thereof, a second rectangular pattern arranged apart from the first pattern in the first direction and having the first pattern as longitudinal direction thereof, and a third rectangular pattern arranged apart from the first and second patterns in a second direction intersecting the first direction and having the first direction as a longitudinal direction thereof, and in which a plurality of auxiliary patterns extend respectively on the first, second, and third patterns, in the second direction and are arranged such that an interval in the first direction between the adjacent auxiliary patterns becomes smaller toward a central portion of the patterns;

using the mask to conduct exposure in order to form first, second, and third resist patterns on the resist film, the first, second and third resist patterns respectively corresponding to the first, second, and third patterns arranged on the mask;

using the first, second, and third resist patterns to form first, second, and third element-isolation regions on the semiconductor substrate surface respectively corresponding to the first, second, and third resist patterns; and forming a gate electrode, which extends in the second direction and is formed from an upper surface of the first element-isolation region to an upper surface of the third element-isolation region through an area between the first and third element-isolation regions and from an upper surface of the second element-isolation region to the upper surface of the third element-isolation region through an area between the second and third element-isolation regions.

12. A method of manufacturing a semiconductor memory element according to claim 11, wherein sizes of the first, second, and third patterns are substantially equal to each other.

13. A method of manufacturing a semiconductor memory element according to claim 11, wherein the auxiliary pattern decreases light intensities of the central portions of the first, second, and third patterns.

14. A method of manufacturing a semiconductor memory element according to claim 11, wherein the method is applicable to an electrically programmable read-only memory.

15. A method of manufacturing a semiconductor memory element according to claim 11, wherein a width of the gate electrode in the first direction is not more than 0.2 µm.

16. A method of manufacturing a semiconductor memory element according to claim 11, wherein dimensions of the central portions of the first, second, and third patterns in the second direction are longer than dimensions of both of the end portions of the first, second, and third patterns in the second direction.

17. A method of manufacturing a semiconductor memory element according to claim 11, wherein correction patterns respectively including the four corners of the first, second, third patterns are respectively arranged on the first, second, and third patterns.

18. A method of manufacturing a semiconductor memory element according to claim 14, wherein the read-only memory includes an EPROM, an EEPROM, and a flash memory.

19. A method of manufacturing a semiconductor memory element according to claim 15, wherein a width of the gate electrode in the first direction is about 0.16 µm.

* * * * *